United States Patent
Laskaris et al.

(10) Patent No.: US 6,259,252 B1
(45) Date of Patent: *Jul. 10, 2001

(54) LAMINATE TILE POLE PIECE FOR AN MRI, A METHOD MANUFACTURING THE POLE PIECE AND A MOLD BONDING POLE PIECE TILES

(75) Inventors: Evangelos T. Laskaris, Niskayuna; William D. Barber, Ballston Lake; Johannes M van Oort, Niskayuna; Bulent Aksel, Clifton Park; Paul S. Thompson, Stephentown; Michele D. Ogle, Burnt Hills, all of NY (US)

(73) Assignee: General Electric Company, Schenectady, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/198,507

(22) Filed: Nov. 24, 1998

(51) Int. Cl.[7] .............................. G01V 3/00; G01R 33/20
(52) U.S. Cl. .............................. 324/319; 29/609
(58) Field of Search .................... 335/297, 296; 324/320, 319, 322, 318; 29/609

(56) References Cited

U.S. PATENT DOCUMENTS

| 4,496,395 | 1/1985 | Croat | 75/123 |
| 4,540,453 | 9/1985 | Boredelon et al. | 148/31.55 |
| 4,818,966 | 4/1989 | Miyamoto et al. | 335/296 |
| 5,252,924 | 10/1993 | Sakurai et al. | 324/320 |
| 5,283,544 | 2/1994 | Sakurai et al. | 335/297 |
| 5,317,297 | 5/1994 | Kaufman et al. | 335/297 |
| 5,383,978 | 1/1995 | Yamamoto et al. | 148/101 |
| 5,475,355 | * 12/1995 | Abele et al. | 335/301 |
| 5,631,616 | 5/1997 | Ohta et al. | 335/216 |
| 5,680,086 | 10/1997 | Allis et al. | 335/296 |
| 6,150,819 | * 11/2000 | Lasarkis et al. | 324/319 |

FOREIGN PATENT DOCUMENTS

1004888A1 * 5/2000 (GB).

* cited by examiner

Primary Examiner—Christine Oda
Assistant Examiner—Tiffany A. Fetzner
(74) Attorney, Agent, or Firm—Foley & Lardner

(57) ABSTRACT

A laminate tile pole piece for an MRI. Each laminate tile has a trapezoidal or annular sector shape. The trapezoidal shape allows the tiles to be attached side by side to form a multiple concentric annular array pole piece without using oddly shaped edge filler tiles needed to fill a circular pole piece with square tiles. The pole piece is made by placing a plurality of tiles into a mold and filling the mold with an adhesive substance to bind the plurality of tiles into a unitary tile body. The unitary tile body is then removed from the mold and attached to a pole piece base to form the pole piece. The mold cavity surface preferably has a non-uniform contour. The bottom surface of the unitary tile body forms a substantially inverse contour of the mold cavity surface contour.

26 Claims, 14 Drawing Sheets

LAMINATE TILE POLE PIECE FOR AN MRI, A METHOD MANUFACTURING THE POLE PIECE AND A MOLD BONDING POLE PIECE TILES

FIELD OF THE INVENTION

The present invention is directed to a laminate tile pole piece for an MRI system, a method manufacturing the pole piece and a mold used for bonding a pole piece tiles.

BACKGROUND OF THE INVENTION

In recent years, a so-called laminate tile pole piece has been developed for an MRI. In view of such development, a plan view of the laminate tile pole piece is shown in FIG. 1A and a side view is shown in FIG. 1B. The pole piece 10 comprises a soft iron circular base plate 11, a soft iron ring 12 around the circumference of the base 11 for directing the magnetic flux into the gap between magnets, soft ferrite laminate tiles 13 and 14 and a soft iron core 15 for mounting a gradient magnetic coil. The laminate tiles 13, 14 and the core 15 comprise the pole piece face. The laminate tiles 14 in the center of the base plate 11 have a greater thickness than laminate tiles 13 at the periphery of the base plate 11 to form a convex protrusion 16. The convex protrusion 16 improves the uniformity of the magnetic field.

However, the prior art laminate tile pole piece has several disadvantages. First, most laminate tiles 13, 14 have a square or rectangular shape. However, the base 11 and the ring 12 have a circular shape. Therefore, in order to fit square or rectangular tiles into a circular opening, edge filler tiles 13A are required. As shown in FIG. 1A, each edge filler tile 13A has a unique, odd shape to allow the peripheral tiles 13 to completely fill the circular base 11 and ring 12. Each edge filler tile 13A must be formed separately from other tiles 13 to create its unique shape. This increases process costs and complexity.

Second, the protrusion 16 also has a circular shape, as shown in FIG. 1A. Therefore, in order to arrange the square or rectangular central tiles 14 in a circle, edge filler tiles 14A are required, as shown in FIGS. 1A and 1B. The edge filler tiles 14A also have a unique, odd shape to allow central tiles 14 to form a circular protrusion 16. Furthermore, in order to allow central tiles 14 to fit with the peripheral tiles 13 without leaving gaps, edge filler tiles 14A also must have two different thicknesses, as shown in FIG. 1B. Each uniquely shaped edge filler tile 14A must also be formed separately from other central tiles 14. This further increases process costs.

Third, the prior art methods of attaching individual laminate tiles 13, 14 to the base 11 involve placing the individual tiles onto the base and then poring epoxy over the tiles. However, the epoxy may flow out of the base and coat portions of the pole piece not intended to be coated by epoxy. Some tiles may also be insufficiently coated with the epoxy because the epoxy is not supplied under pressure. These tiles may become delaminated during MRI use. Furthermore, it becomes very difficult to achieve the optimum height for the protrusion 16 by manually stacking tiles 14 onto a base 11 because of human error. Therefore, different pole pieces manufactured by the prior art method suffer from poor reproducibility and have different performance characteristics due to a variance in the height of the protrusion.

SUMMARY OF THE INVENTION

In view of the foregoing, it would be desirable to decrease the manufacturing process cost and complexity by forming a laminated tile pole piece that does not contain oddly shaped edge filler tiles. The present invention provides a pole piece for a magnetic resonance imaging (MRI) system. The pole piece comprises a plurality of trapezoid or annular sector shaped tiles arranged in a plurality of concentric annular arrays.

It would also be desirable to obtain a reproducible and accurate laminate tile pole piece manufacturing process. The present invention provides a method of making a pole piece. The method comprises placing a plurality of tiles into a mold cavity, filling the mold cavity with an adhesive substance to bind the plurality of tiles into a unitary body, removing the unitary body from the mold cavity and attaching a second surface of the unitary body to a pole piece base to form a first pole.

The present invention also provides a mold containing an non-uniform cavity surface for forming a laminate tile pole piece for an MRI system. The mold is made by performing a simulation of magnetic flux density between a first magnet of the MRI system and a second magnet of the MRI system, determining an optimum contour of a first surface of the pole piece based on an optimum value of the magnetic flux density between the first magnet and the second magnet and forming the mold cavity surface contour as a substantial inverse of the optimum contour of the first surface of the pole piece.

DETAILED DESCRIPTION OF THE PREFERRED EMBODIMENTS

Figure 1A:
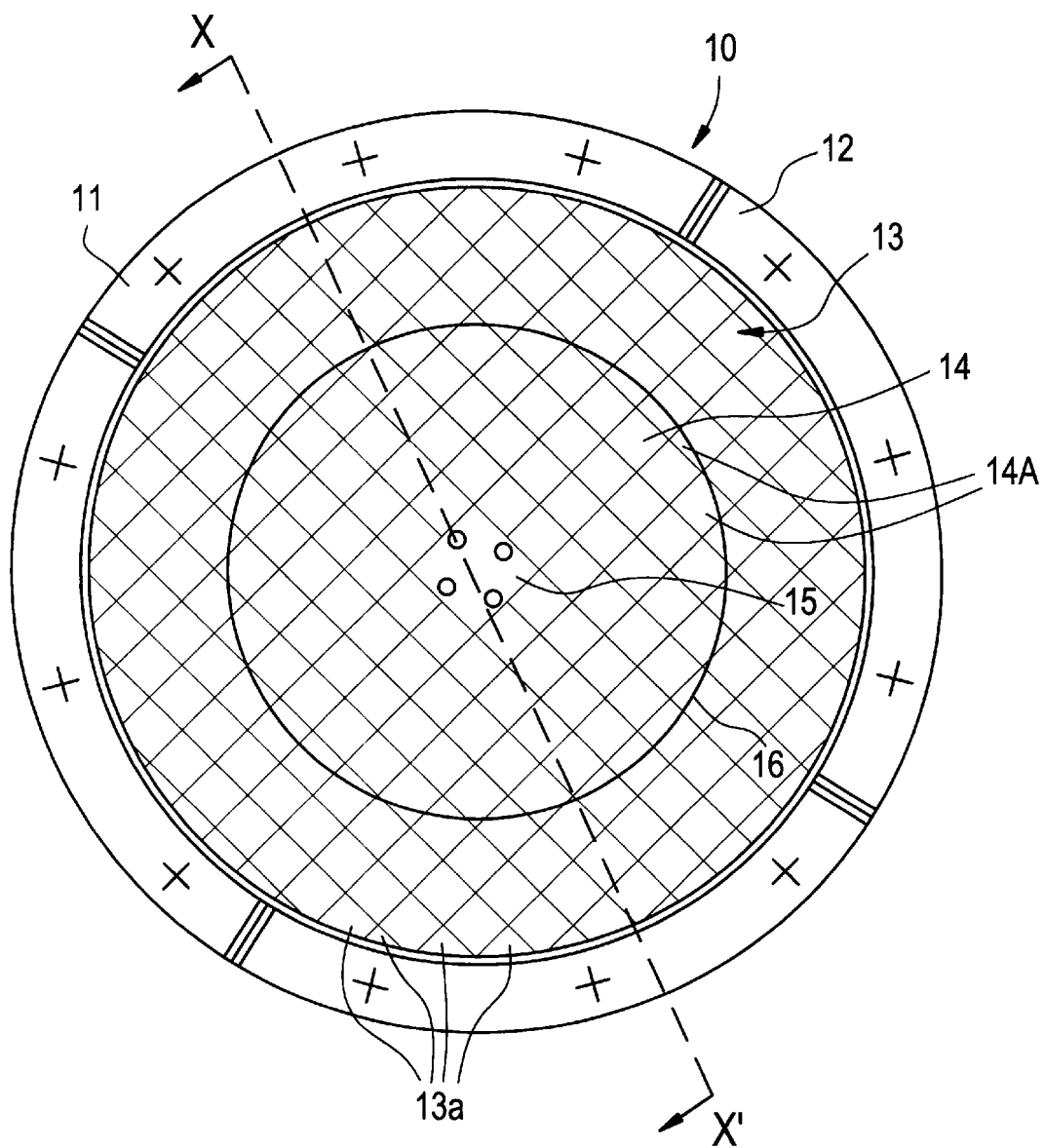
FIG. 1A is a plan view of a prior art pole piece.
Figure 1B:
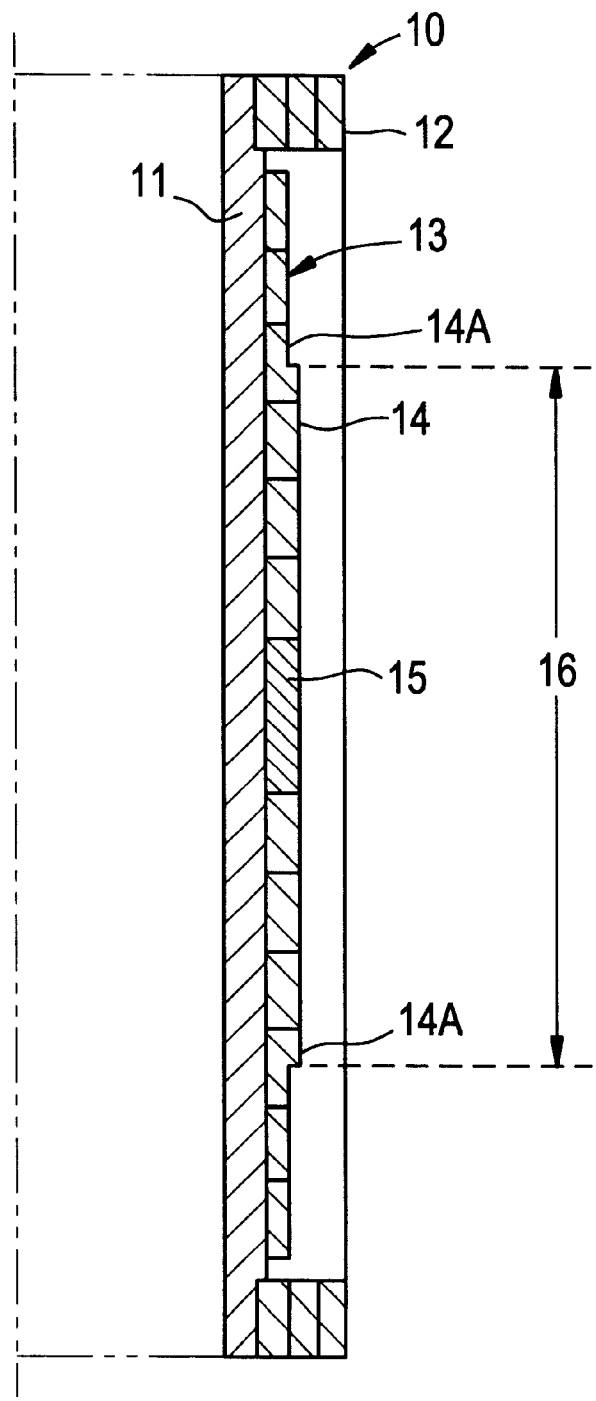
FIG. 1B is a side cross sectional view of a prior art pole piece across line X–X' in FIG. 1A.
Figure 2A:
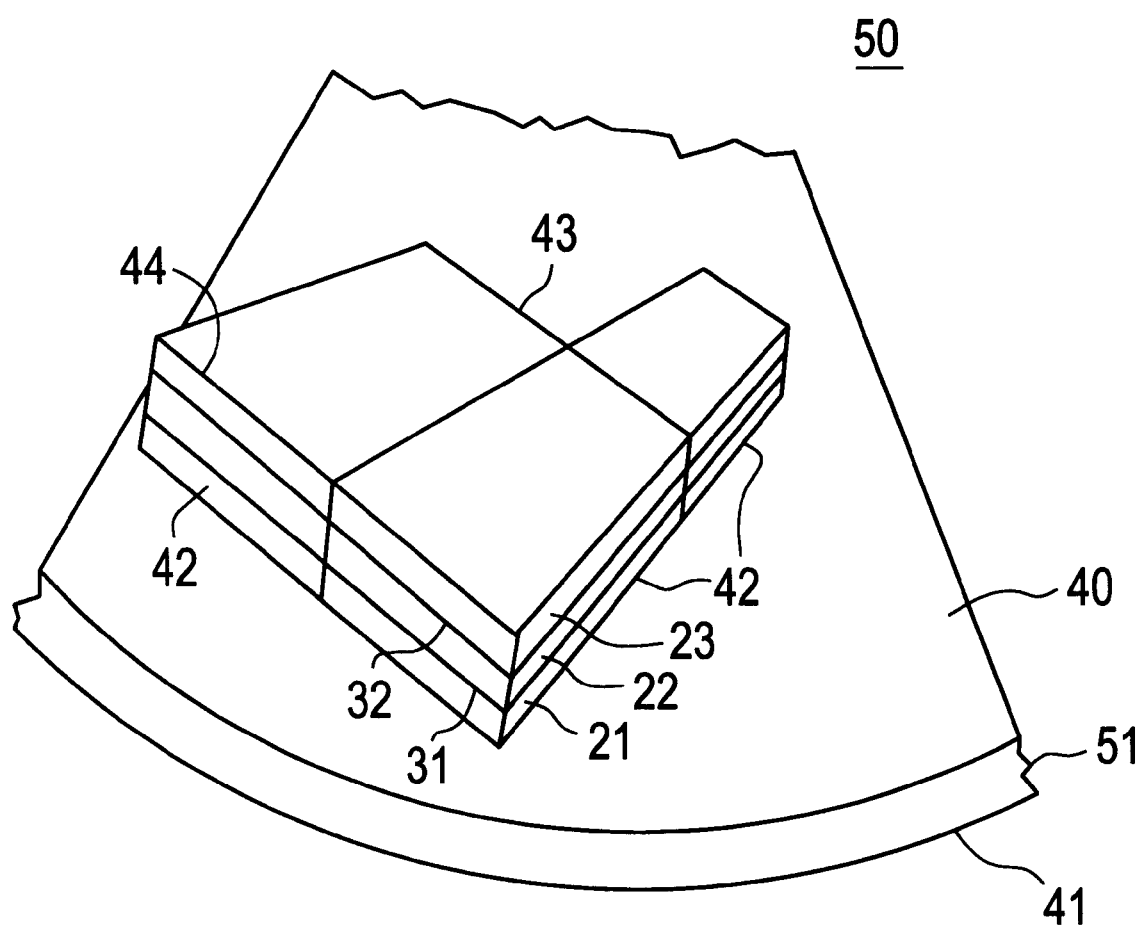
FIG. 2A is a perspective view of a laminate tile arrangement according to the first embodiment of the current invention.

FIG. 2A shows a perspective view of a cut away portion of a pole piece 50 comprising a pole piece base 51 having a first surface 40 and a second surface 41. Pole piece laminate tiles 42 are attached to the first surface 40 of the base 51. The tiles 42 may be attached to the base 51 by epoxy, glue and/or bolts. Each laminate tile comprises interposed plural metal layers, shown as 21, 22, 23, and adhesive layers, shown as 31, 32. Each laminate tile 42 actually contains 100 to 10,000 metal layers, where each metal layer is preferably less than $5 \times 10^{-3}$ inches thick (i.e. less than 5 mils thick). Each tile is 0.1 to 10 inches thick and 1 to 30 inches wide. For example, each tile is about 8 inches wide in its middle and 1 inch thick, and contains 1000 1 mil thick metal layers. However, the tiles and the metal layers may have other dimensions based on the required end use. Furthermore, each tile may alternatively comprise a solid metal block or bar instead of metal layer laminates.

The laminate tiles 42 are preferably fabricated from amorphous metal layers. However, the metal does not have to be amorphous and may have a crystalline structure. The metal may comprise steel, iron, silicon steel or iron (i.e. non-oriented silicon steel), nickel steel or iron, permendur (FeCoV), nickel chromium steel or iron, aluminum steel or iron, aluminum chromium steel or iron or any other low coercivity material. Furthermore, the pole pieces 50 according to the current invention may comprise laminate tiles 42 made from different metals listed above. In other words, adjacent tiles may comprise different metals.

The laminate tiles 42 preferably have a trapezoidal shape. However, laminate tiles may have an annular sector shape. An annular sector is a trapezoid that has a concave top or short side 43 and a convex bottom or long side 44. The trapezoidal laminate tiles 42 may be manufactured by adhering plural metal sheets with an adhesive and subsequently cutting the laminate sheets into trapezoidal tiles. Another method of making laminate tiles 42 is disclosed in a U.S. Pat. No. 6,150,819 to E. Trifon Laskaris et al., filed on the same date the current application, and incorporated herein in its entirety. This method comprises unwinding a metal ribbon, guiding the ribbon through an adhesive bath, winding the ribbon on a polygonal bobbin, such as a rectangular bobbin, to form a coil with at least one flat side, removing the coil from the bobbin, cutting the coil into laminate bars and shaping the laminate bars into trapezoidal or annular sector shaped laminate tiles.

Figure 2B:
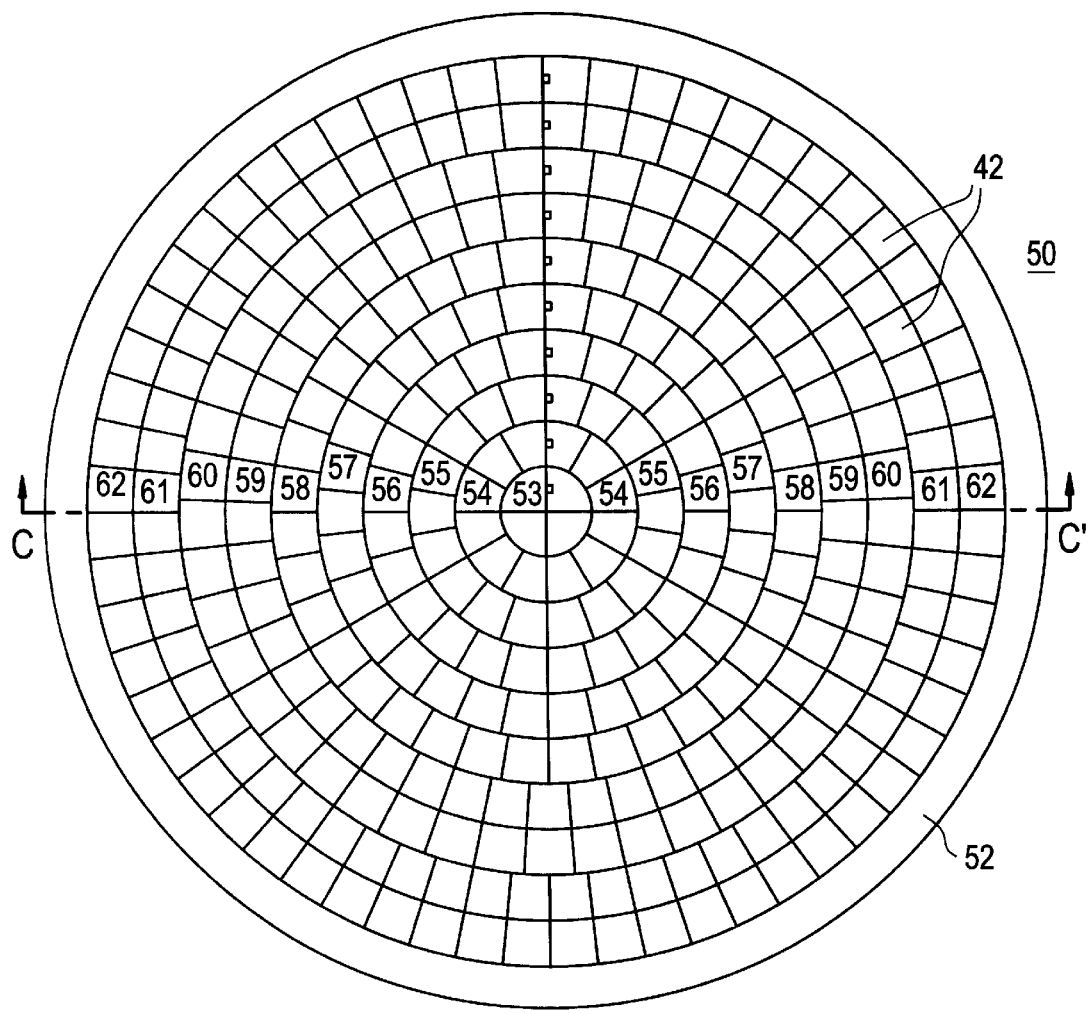
FIG. 2B is a plan view of a laminate tile arrangement according to the first embodiment of the current invention.
Figure 2C:
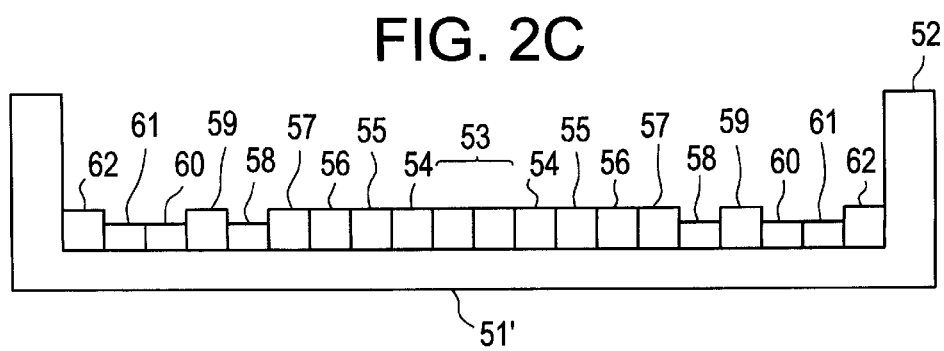
FIG. 2C is a side cross sectional view taken along line C–C' in FIG. 2B of a laminate tile arrangement according to the first embodiment of the current invention.

As shown in FIGS. 2B and 2C, the circular pole piece base 51 contains a support ring 52 for containing laminate tiles 42 and for directing the magnetic flux into a gap between magnets. The entire circular base 51 and the ring 52 are filled in with trapezoidal laminate tiles 42. The base 51 and ring 52 are sometimes called a "pole shoe." Alternatively, the ring 52 is sometimes called an "edge shim." FIG. 2B shows a plan view of the pole piece 50, while FIG. 2C shows a cross sectional view taken along line C–C' in FIG. 2B. The laminate tiles are arranged in concentric annular arrays or rings 53 to 62. The advantage of the trapezoidal or annular sector shape of the laminate tiles 42 becomes apparent from FIG. 2B. All laminate tiles may have the same size and shape. Therefore, no oddly shaped edge filler tiles are necessary to fill the base 51 and the ring 52. The cost and complexity of the method of assembling the laminate tile pole piece is thus reduced.

For example, the concentric tile annular arrays 53–57 near the center of the base 51 may have a larger thickness (i.e. height as measured from the base 51) than concentric tile annular arrays 58, 60 and 61 near the periphery of the base 51 to form a protrusion near the center of the base 51. The protrusion also does not require oddly shaped edge filler tiles. Optionally, the peripheral concentric annular arrays 59 and 62 may also have a larger thickness than peripheral annular arrays 58, 60 and 61. Of course other annular array thickness and configurations are possible. For example, there may be more or less than 10 concentric annular arrays. All the annular arrays may have the same thickness or different thickness. The number of annular arrays and the particular annular array thickness should be determined by a computer simulation of magnetic field flow between MRI system magnets through the pole piece 50. Alternatively, the central annular array 53 may be an iron core for mounting a gradient magnetic coil.

Furthermore, the annular arrays may be formed by stacking plural laminate tiles 42 on each other. The thicker concentric annular arrays may comprise more stacked laminate tiles than the thinner annular arrays. The space between the top of the pole piece support ring 52 and the laminate tiles may optionally be filled by passive shims.

Figure 3A:
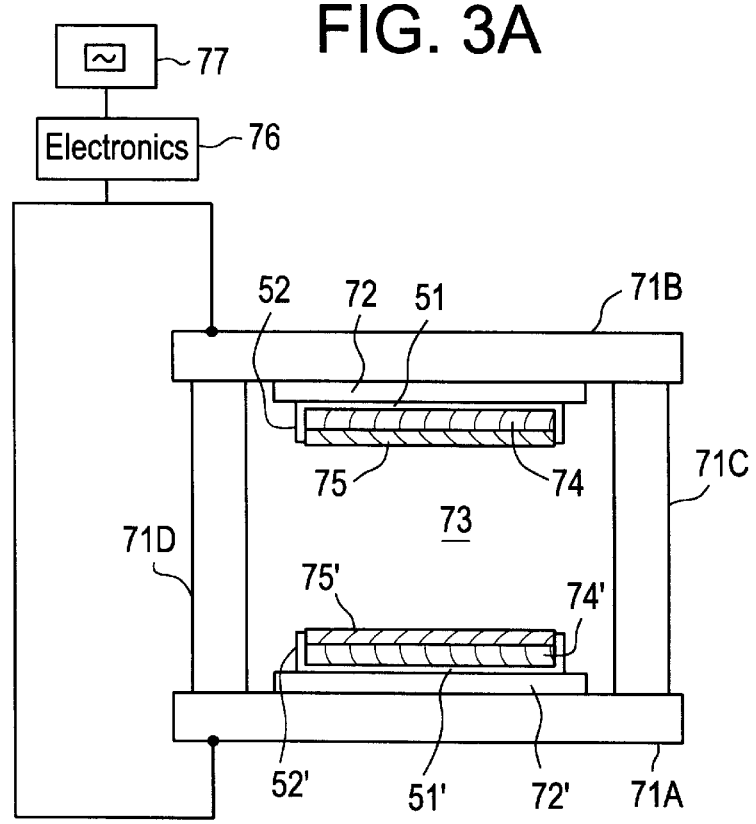
FIGS. 3A and 3B are side cross sectional views of MRI systems.
Figure 3B:
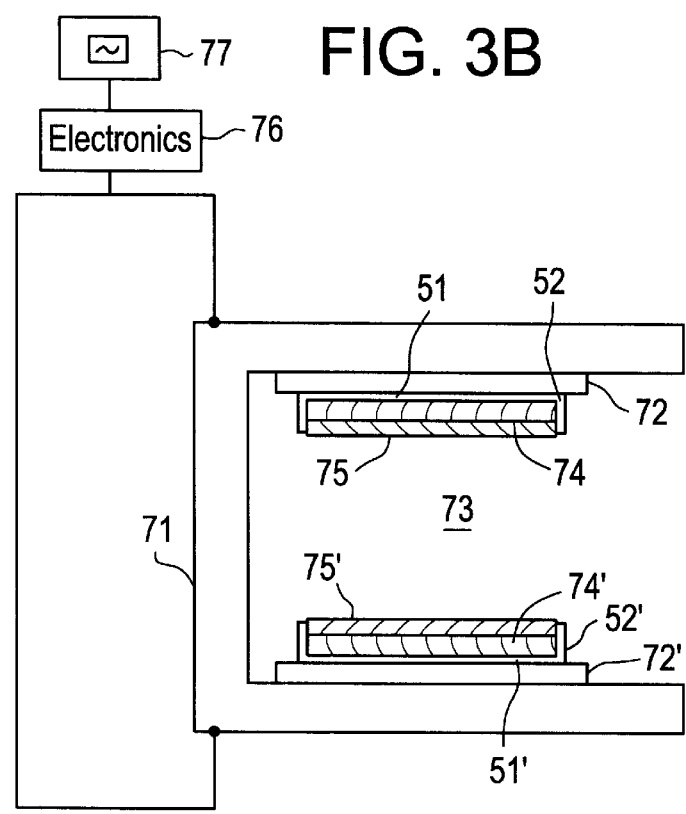

Embodiments of magnetic field generating devices used for magnetic resonance imaging, MRI, ("MRI system") according to the present invention are shown in FIGS. 3A and 3B. The MRI system shown in FIG. 3A has two plate yokes 71A and 71B and at least two, and preferably four columnar yokes 71C and 71D. Alternatively, an MRI system with a single "C" shaped yoke 71 may be used as shown in FIG. 3B. The MRI systems contain magnets 72, 72' secured to yoke surfaces, pole piece bases 51, 51' and support rings 52, 52' secured to the magnets 72, 72' and laminate tile pole pieces 74, 74' secured to the pole piece bases and support rings. A gap 73 is formed between the pole pieces. A body part to be imaged is inserted into the gap 73.

The magnets 72, 72' may comprise permanent magnets such as RFeB, RCoFeB or SmCo magnets, or electromagnetic magnets, such as a conductive or superconductive coil wrapped around a core. The MRI systems may also optionally contain gradient coils or shims shown as 75, 75' in FIGS. 6A and 6B. Furthermore, the MRI systems may optionally contain an insulating, low magnetic permeability layer, such as Bakelite, synthetic resin, wood, or ceramic, between the base and the laminate tiles to reduce the remnant magnetism in the pole pieces.

The MRI systems also may contain electronics 76 and a display 77. The electronics 76 may comprise a control system, a transmitter, a receiver, an imager and/or a memory.

The optimum contour of the laminate tile pole pieces is determined by a simulation of the magnetic flux between the top magnet 72 and bottom magnet 72. For example, the simulation may comprise a conventional finite element analysis method. The optimum height for each concentric annular pole piece array 53–62 is determined from the simulation.

Figure 4A:
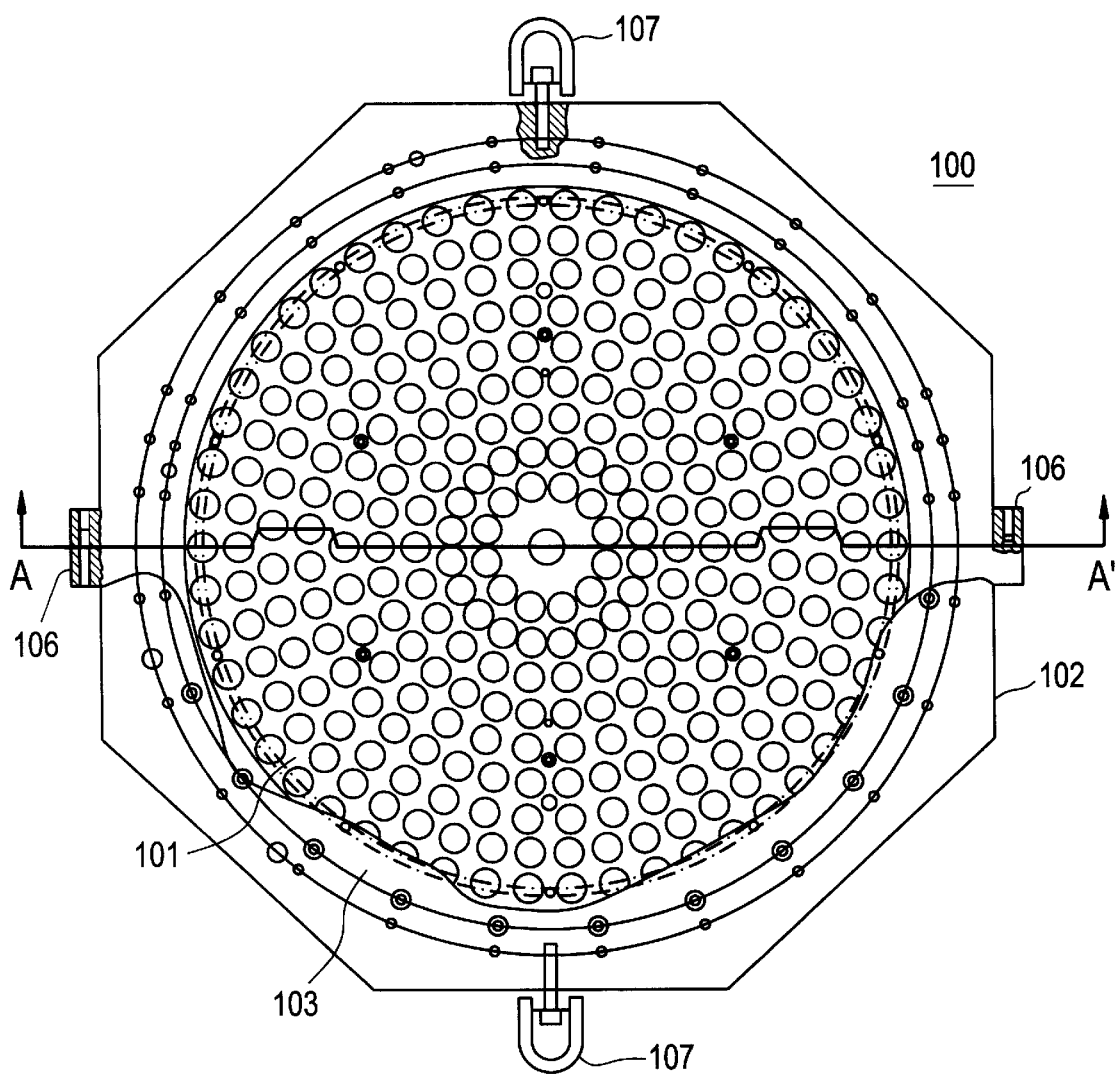
FIG. 4A is a plan view of a mold according to the present invention.
Figure 4B:
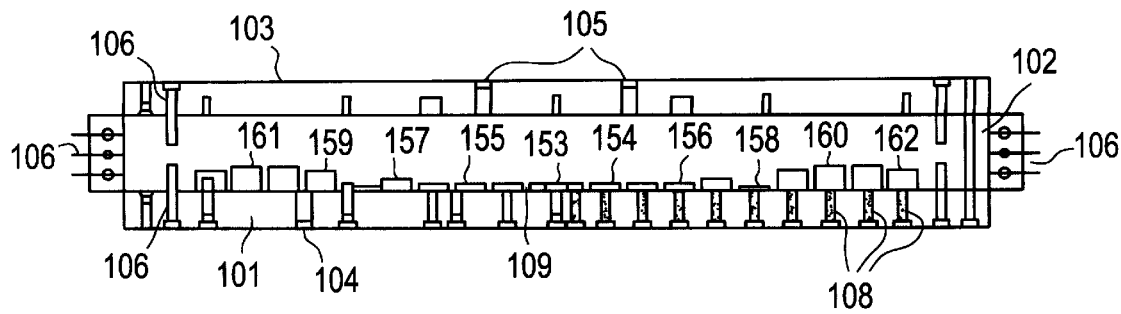
FIG. 4B is a side cross sectional view of the mold along line A–A' in FIG. 4B.

The laminate tile pole piece 50 containing the concentric annular arrays is preferably manufactured using a mold and a molding method of the present invention. An embodiment of the mold 100 is shown in FIGS. 4A and 4B. FIG. 4B is a cross sectional view taken along line A–A' in FIG. 4A. The mold contains a bottom surface 101, a side surface 102 and a cover plate 103. The mold further contains one or more epoxy inlet openings 104 and one or more air outlet openings 105. The opening(s) 104 is preferably made in the bottom mold surface 101 and the opening(s) 105 is preferably made in the cover plate 103. The bottom mold surface 101 and cover plate 103 are preferably attached to the side wall 102 by bolts 106. However, the bottom surface 101 and the side surface 102 may alternatively comprise a unitary body and the cover plate 103 may be attached to the side wall 102 by other ways, such as a latch. The mold 100 has optional handles 107.

The mold preferably contains a non-uniform cavity surface contour. Preferably, the non-uniform contour is established by attaching spacers to the mold cavity bottom surface 101. Preferably, the spacers form a plurality of concentric annular arrays 153–162 around the circular bottom mold surface 101. The spacers may be attached to the mold cavity surface 101 by screws 108 or by glue. Preferably the spacers have a cylindrical shape. However, the spacers may have any other shape.

As shown in FIG. 4B, spacers in different concentric annular arrays 153–162 have a different height or thickness. Preferably there are as many spacers as there are laminate tiles 42 in the pole piece. Each spacer corresponds to a particular pole piece tile. The spacer surface in the mold forms a substantially inverse contour of the pole piece concentric annular tile array contour. In other words, if the pole piece annular array, such as tile array 62, has a large height or thickness, then the corresponding spacer array in the mold, such as spacer array 162 has a small height or thickness. If the pole piece annular array, such as tile array 61, has a small height or thickness, then the corresponding spacer array in the mold, such as spacer array 161 has a large height or thickness. "Substantially inverse" means that the spacer contour may differ from the tile contour. For example, the tiles are attached to each other by an epoxy adhesive, while there may be gaps 109 between the spacers. Thus, the spacer contour also contains the gaps 109, while the tile contour does not contain the thin protrusions that would correspond to the gaps. Furthermore, there may be other slight vertical and horizontal variations in the contours.

Figure 4C:
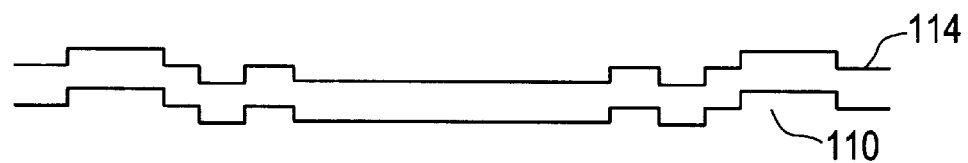
FIG. 4C is a schematic of the pole piece and mold cavity surface contours.

Therefore, the contour of the non-uniform mold cavity surface 110 is an inverse of a laminate tile pole piece contour 114, as shown in FIG. 4C. The contour of the laminate tile pole piece is determined by performing simulation of a magnetic flux density between the MRI system magnets for different tile contours and then choosing the tile contour 114 which produces the optimum magnetic flux between the MRI system magnets. The magnetic flux lines from a finite element simulation of a field between two hypothetical MRI magnets are superimposed on the plan view of the mold in FIG. 4A.

Figure 4D:
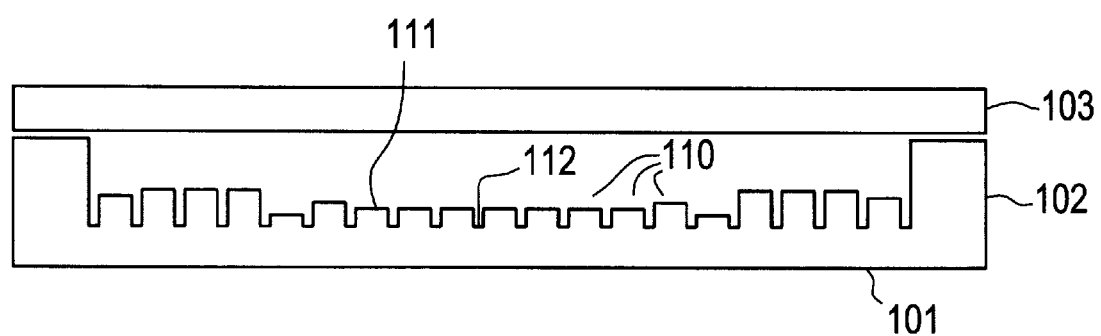
FIG. 4D is a side cross sectional view of a mold according to an alternative embodiment of the present invention.

Alternatively, the non-uniform mold cavity surface contour may be made without using spacers 153–162, as shown in FIG. 4D. In FIG. 4D, the mold cavity surface itself is irregularly shaped to form a non-uniform contour 110. The contour 110 comprises protrusions 111 and recesses 112. The protrusions 111 form plural concentric annular arrays whose contour is the substantial inverse of the pole piece tile contour. As with the mold shown in FIG. 4B, each protrusion 111 should correspond to an individual tile 42 of the pole piece.

Figure 5A:
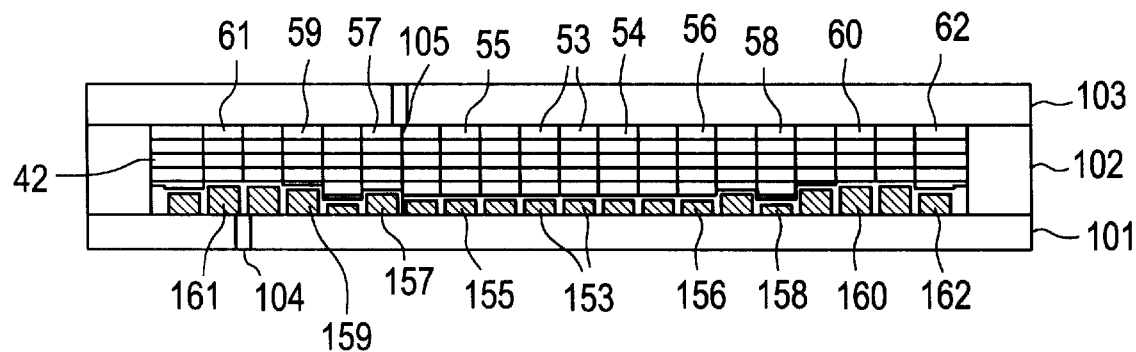
FIG. 5A is a side cross sectional view of the mold filled with laminate tiles according to the present invention.
Figure 5B:
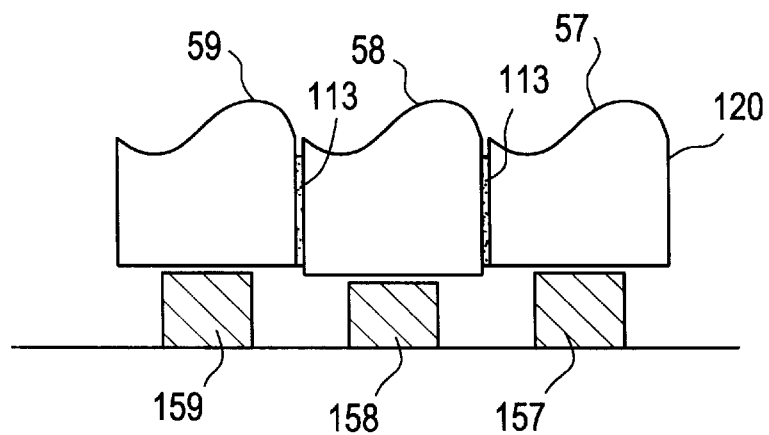
FIG. 5B is a close up side cross sectional view of a section of FIG. 5A.
Figure 5C:
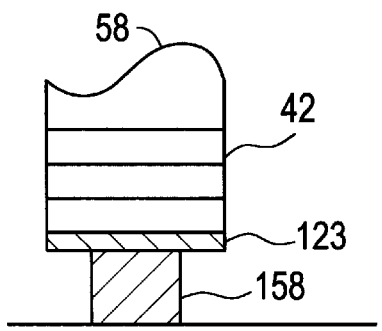
FIG. 5C is a side cross sectional view of a laminate tile according to another embodiment of the present invention.

A method of making the laminate tile pole piece according to the present invention is shown in FIGS. 5 and 6. The mold cavity and the spacers are first coated with a release agent. Laminate tiles 42 are then placed into the mold cavity in concentric annular tile arrays 53–62, as shown in FIG. 5A. The tiles are stacked on top of the corresponding concentric annular spacer arrays 153–162. Of course, the spacers may be replaced by the protrusions of FIG. 4C. Each tile should overlie one spacer, as shown in FIG. 5B. The height of each tile and spacer stack should equal to the height of the mold cavity, such that the top surface of the tile arrays 53–62 is level with the top of the mold cavity. All variations as a result of tile height tolerances are taken as a small gap near the top of the mold cover plate 103. Alternatively, each tile may be attached to its respective spacer with adhesive tape 123, as shown in FIG. 5C.

The mold is then covered with the cover plate 103 and an adhesive substance is introduced into the mold through the inlet opening 104. The adhesive substance is preferably a synthetic epoxy resin. The epoxy does not becomes attached to the mold cavity and the spacers because they are coated with the release agent. The epoxy permeates between the individual tiles and forces out any air trapped in the mold through outlet opening(s) 105. The epoxy 113 binds the individual tiles into a unitary body 120 comprising concentric annular tile arrays 53–62 of different height. Alternatively, the epoxy may be introduced through the top opening 105 or through both top and bottom openings.

Figure 6A:
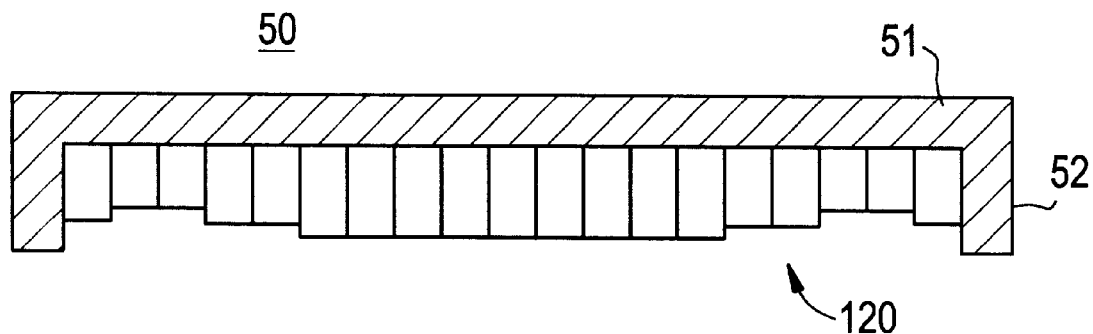
FIG. 6A is side cross sectional view of a laminate tile pole piece according the present invention.
Figure 6B:
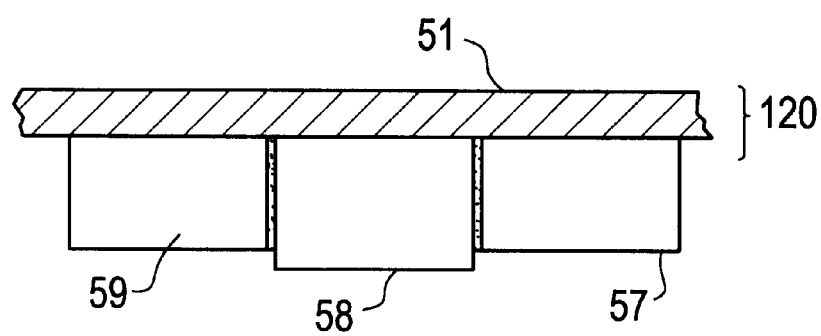
FIG. 6B is a close up side cross sectional view of a section of FIG. 6A.

The mold cover plate 103 is taken off the mold and the unitary tile body 120 is removed from the mold 100. The unitary body 120 is then attached with its flat (top) side to the pole piece base 51 and ring 52, as shown in FIGS. 6A and 6B. The base 51, ring 52 and the unitary tile body comprise the pole piece 50. The unitary tile body 120 may be attached to the base 51 by epoxy, glue and/or bolts.

Figure 7A:
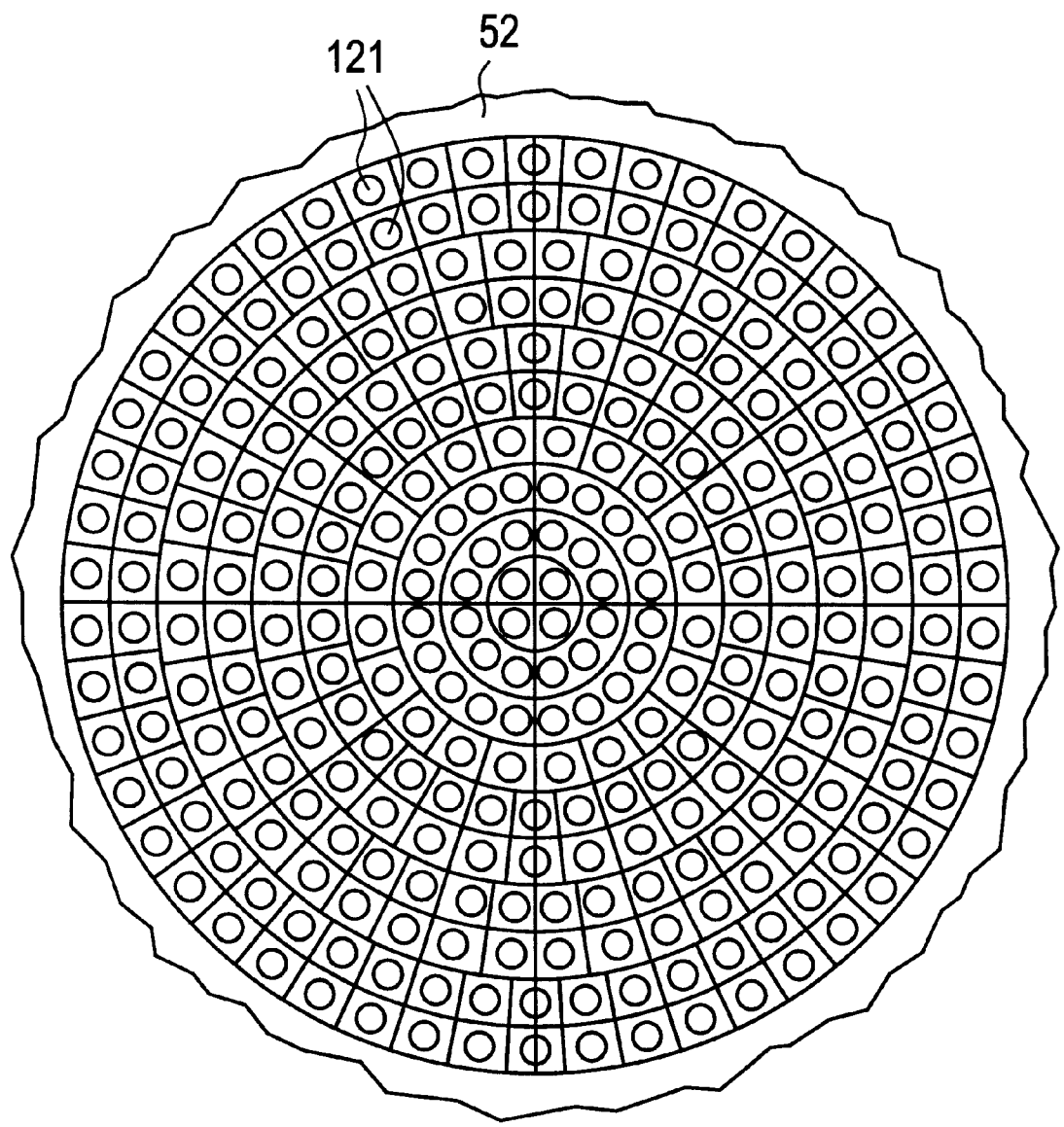
FIG. 7A is a plan view of a laminate tile arrangement according to the second embodiment of the current invention.
Figure 7B:
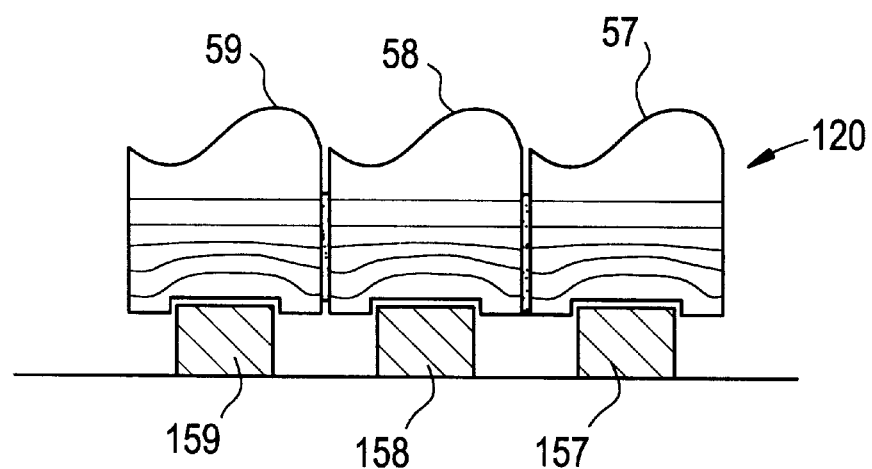
FIG. 7B is a side cross sectional view of a section of FIG. 7A.
Figure 7C:
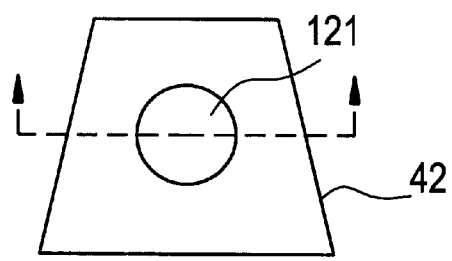
FIG. 7C is a plan view of a laminate tile according to the second embodiment of the current invention.
Figure 7D:
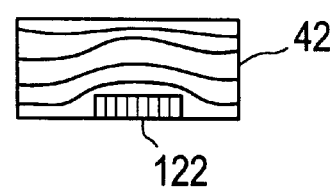
FIG. 7D is a side cross sectional view of a laminate tile according to the second embodiment of the current invention.

The second embodiment of the present invention is shown in FIGS. 7A to 7D. In the second embodiment, at least one tile 42 contains a cavity 121 in its face, as shown in FIGS. 7A and 7C. The cavity may be formed by introducing the epoxy 113 into the mold 110 at high pressure. The high pressure epoxy flows over the concentric annular tile arrays 53–62 and presses the tile arrays against the cylindrical spacers 153–162 or protrusions 111 in the mold cavity. Each spacer or protrusion has a smaller surface area than the area of the corresponding tile. Therefore, pressure of the comparably softer tiles against the spacers or protrusions forms cavities 121 in the tiles, as shown in FIGS. 7A–7B. The cavities may be filled by passive shims or small permanent magnets 122 as shown in FIG. 7D and described in copending application as disclosed in U.S. Pat. No. 5,923,235 to Johannes M. van Oort, filed Oct. 23, 1998, hereby incorporated by reference in its entirety.

Figure 8:
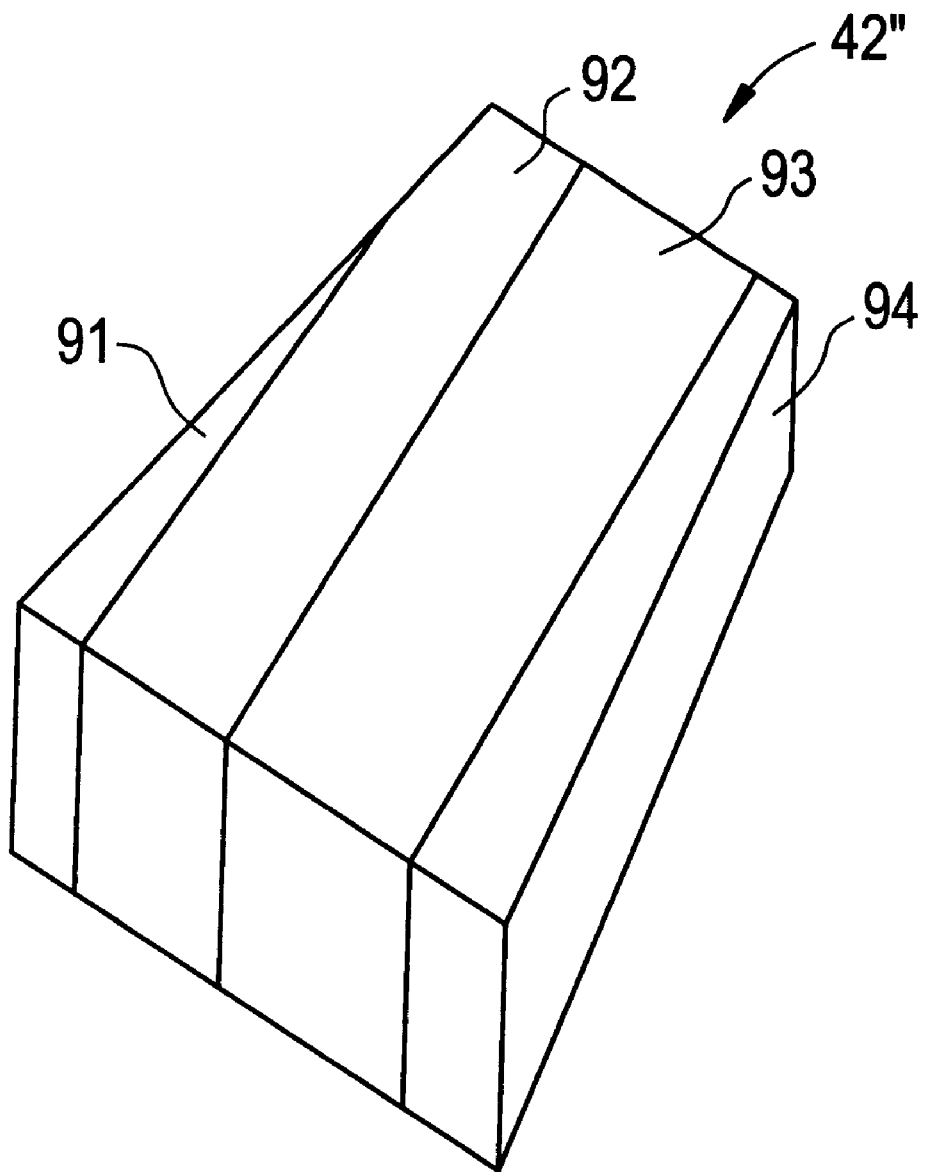
FIG. 8 is a perspective view of a laminate tile according to the third embodiment of the current invention.

In FIG. 2A, the laminate layers are laminated along the height or thickness direction of the laminate tile 42. However, in a third embodiment of the present invention, the laminate layers 91, 92, 93, 94 are stacked or laminated along the width of the laminate tile 42'', as shown in FIG. 8. Laminate tile 42'' may be produced by forming a thick stack or coil of epoxy bound metal layers, cutting a tile from the stack or coil and turning the tile on its side.

Figure 9A:
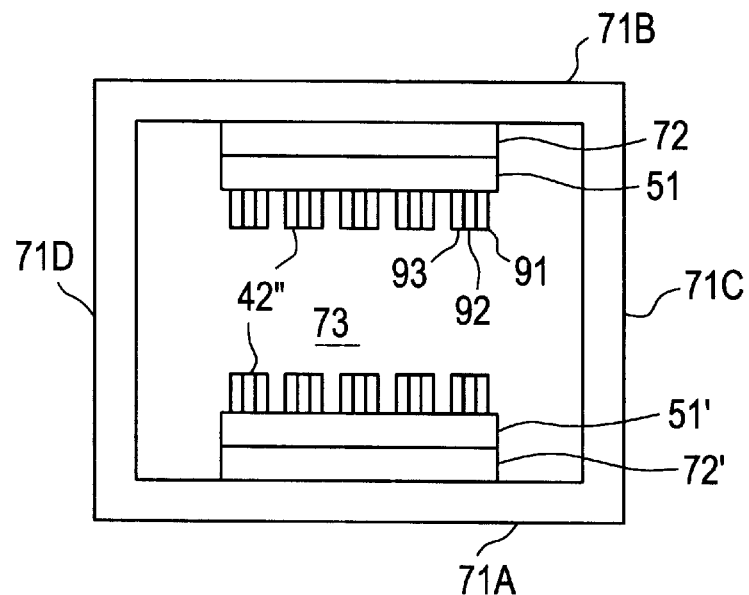
FIGS. 9A and 9B are side cross sectional views of MRI systems according the third embodiment of the current invention.
Figure 9B:
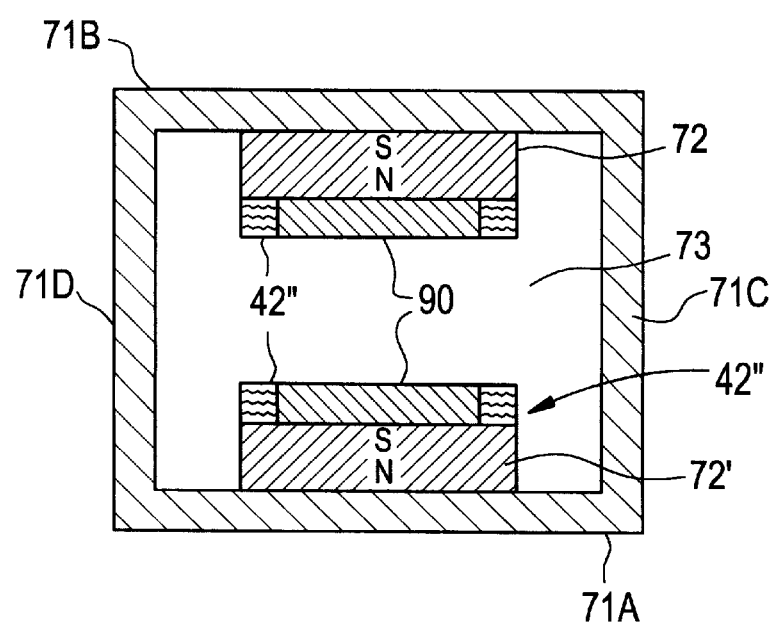

Laminate tile 42'' is mounted on the pole piece base 51 with the laminating direction perpendicular to the direction of the magnetic flux (i.e. perpendicular to an imaginary line between the bottom magnet 72' and the top magnet 72) as shown in FIG. 9A. In other words, the laminating direction is parallel to the plane of the concentric annular tile arrays. The advantage of the this embodiment is increased stability of the magnetic field and a decrease in eddy currents and hysteresis effects. Alternatively, the laminate tile 42" may be mounted on the edge of another pole piece member 90 to reduce sideways magnetic flux leakage, as shown in FIG. 9B. Member 90 may itself comprise multiple laminate tiles 42 with layers laminated in a direction parallel to the direction of the magnetic flux. In other words, the laminating direction is perpendicular to the laminating direction of tiles 42" and perpendicular to the plane of the concentric annular tile arrays).

Figure 10A:
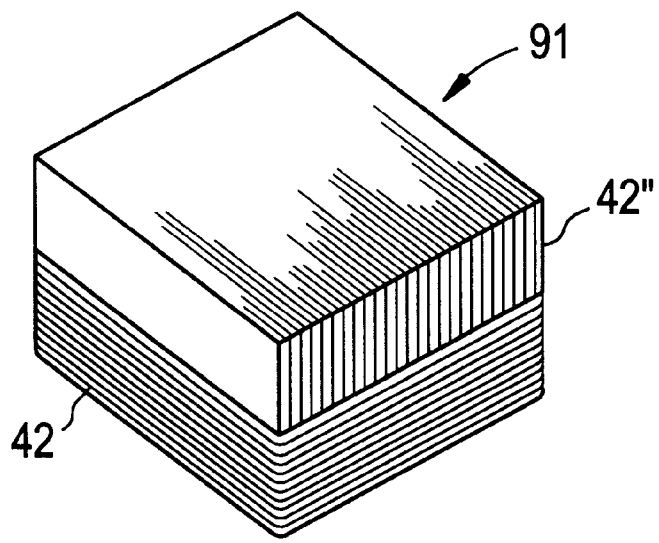
FIGS. 10A and 10B, are perspective views of laminate tiles according to the fourth embodiment of the current invention.
Figure 10B:
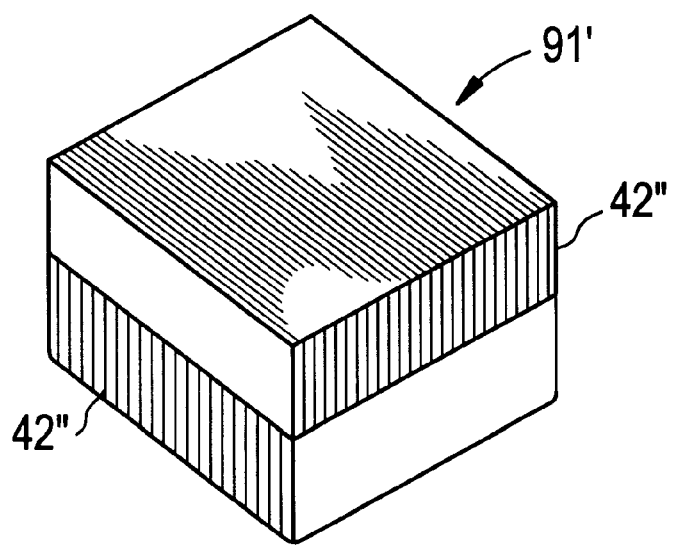

In a fourth embodiment of the present invention, laminate tiles whose laminating directions are different by 90 degrees may be attached to each other. Such an arrangement improves the uniformity of the magnetic field in the gap 73. For example, a laminate tile 42 may be attached to laminate tile 42" to form a combined tile 91 as shown in FIG. 10A. Alternatively, two tiles 42" may be attached to form a combined tile 91' as shown in FIG. 10B. Of course two tiles 42 may also be attached with their laminating directions inclined by 90 degrees to each other. The combined tiles 91 and 91' may be attached to the pole piece base 51 with any surface facing the MRI system gap 73. Combined tiles 91 and 91' may also comprise individual tiles made from different metals listed above.

The laminate tiles were described as being suitable for an MRI system pole piece. However, other uses for the laminate tiles and the laminate tile fabrication method are within the scope of the current invention. The mold may also be used to manufacture unitary bodies for uses other than an MRI system pole piece. Furthermore, in some applications, it may be advantageous to use laminate bars instead of trapezoidal tiles. In this case, the laminate bars may be considered "laminate tiles" for the purposes of this invention.

While the invention has been described in detail and with reference to specific embodiments thereof, it will be apparent to one skilled in the art that various changes and modifications can be made therein without departing from the spirit and scope of the invention.

What is claimed is:

1. A pole piece for a magnetic resonance imaging (MRI) system, comprising:
    a first surface of the pole piece adapted to be connected to and parallel to a pole piece base;
    a second surface of the pole piece adapted to face an imaging gap located between MRI system magnets;
    a side surface of the pole piece; and
    a plurality of trapezoid or annular sector shaped tiles arranged in a plurality of concentric annular arrays in a plane substantially parallel to the first and second surfaces of the pole piece.

2. The pole piece of claim 1, wherein the tiles comprise a plurality of laminated layers.

3. The pole piece of claim 1, wherein a height of a first concentric annular array is greater than a height of a second concentric annular array.

4. The pole piece of claim 3, wherein the surface contour of the plurality of concentric annular arrays forms a substantially inverse contour of a non-uniform mold cavity surface.

5. The pole piece of claim 1, wherein:
    the plurality of concentric annular arrays comprise a unitary tile body;
    the unitary tile body is connected to the pole piece base; and
    a portion of the pole piece base comprises the side surface of the pole piece.

6. The pole piece of claim 1, wherein a first tile is separated from a second tile by an adhesive layer.

7. The pole piece of claim 2, wherein the laminating direction of the tile layers is parallel to a plane of each concentric annular array.

8. The pole piece of claim 2, wherein the laminating direction of the tile layers perpendicular to a plane of each concentric annular array.

9. The pole piece of claim 2, further comprising a first tile containing laminated layers attached over a second tile containing laminated layers to form a combined laminate tile.

10. The pole piece of claim 9, wherein the layer laminating direction of the first tile is perpendicular to the layer laminating direction of the second tile.

11. The pole piece of claim 1, wherein at least one tile contains a cavity in the tile face.

12. The pole piece of claim 11, wherein at least one cavity is filled by a shim or an auxiliary magnet.

13. The pole piece of claim 2, further comprising:
    a yoke;
    a first magnet containing a first side attached to a first portion of the yoke and a second side attached to the base of the laminate tile pole piece;
    a second magnet attached to a second portion of the yoke;
    a second pole piece comprising a plurality of second tiles attached to the second magnet and facing the laminate tile pole piece; and
    wherein the laminate tile pole piece and the second pole piece are arranged on opposite sides of the imaging gap.

14. The pole piece of claim 1, wherein the arrays are arranged in a plane parallel to the first and second surfaces of the pole piece.

15. A pole piece for a magnetic resonance imaging (MRI) system, comprising:
    a first face of the pole piece adapted to be placed toward an imaging gap located between MRI system magnets; and
    a plurality of trapezoid or annular sector shaped tiles arranged in a plurality of concentric annular arrays in the first face of the pole piece.

16. The pole piece of claim 15 wherein:
    the tiles comprise a plurality of laminated layers; and
    a height of a first concentric annular array is greater than a height of a second concentric annular array.

17. The pole piece of claim 16, wherein:
    the plurality of concentric annular arrays comprise a unitary tile body connected to a base;
    a first tile is separated from a second tile by an adhesive layer;
    at least one tile contains a cavity in the first face; and the cavity is filled by a shim or an auxiliary magnet over the first face.

18. A pole piece adapted to be placed adjacent to a first magnet of a magnetic resonance imaging (MRI) system, comprising:

a plurality of trapezoid or annular sector shaped tiles arranged in a plurality of concentric annular arrays in a plane adapted to be substantially perpendicular to a direction of a magnetic field of the first magnet.

19. The pole piece of claim 18, wherein the tiles are arranged in a plane adapted to be perpendicular to a direction of a magnetic field of the first magnet.

20. The pole piece of claim 19, wherein:
the tiles comprise a plurality of laminated layers; and
a height of a first concentric annular array is greater than a height of a second concentric annular array.

21. The pole piece of claim 20, wherein:
the plurality of concentric annular arrays comprise a unitary tile body connected to a base; and
a first tile is separated from a second tile by an adhesive layer.

22. An MRI system, comprising:
a yoke;
a first magnet containing a first side attached to a first portion of the yoke;
a first pole piece having a first side attached to a second side of the first magnet;
a second magnet containing a first side attached to a second portion of the yoke;
a second pole piece having a first side attached to a second side of the second magnet;
wherein:
a gap is formed between a second surface of the first pole piece and a second surface of the second pole piece such that the first and the second pole pieces are arranged on opposite sides of the gap; and
the first pole piece comprises a plurality of trapezoid or annular sector shaped tiles arranged in a plurality of concentric annular arrays in the second surface of the first pole piece.

23. The MRI system of claim 22, wherein the second pole piece comprises a plurality of trapezoid or annular sector shaped tiles arranged in a plurality of concentric annular arrays in the second surface of the second pole piece.

24. The MRI system of claim 23, wherein:
the tiles of the first and the second pole piece comprise a plurality of laminated layers; and
a height of a first concentric annular array is greater than a height of a second concentric annular array in the first and the second pole pieces.

25. The MRI system of claim 24, wherein:
the plurality of concentric annular arrays of the first pole piece comprise a unitary tile body connected to a base;
the base comprises the first side of the first pole piece that is attached to the second side of the magnet; and
a first tile of the plurality of tiles is separated from a second tile of the plurality of tiles by an adhesive layer.

26. The MRI system of claim 22, wherein:
at least one tile contains a cavity in the tile face in the second surface of the first pole piece; and
the cavity is filled by a shim or an auxiliary magnet over the second surface of the pole piece.

* * * * *